United States Patent

Suezawa et al.

[11] Patent Number: 5,958,652
[45] Date of Patent: Sep. 28, 1999

[54] TREATING LIQUID FOR MAKING A WATERLESS PLANOGRAPHIC PRINTING PLATE

[75] Inventors: Mitsuru Suezawa; Atsuko Kawabe; Toshihiko Taniguci, all of Shiga, Japan

[73] Assignee: Toray Industries, Inc., Tokyo, Japan

[21] Appl. No.: 08/860,092

[22] PCT Filed: Nov. 8, 1996

[86] PCT No.: PCT/JP96/03295

§ 371 Date: Sep. 26, 1997

§ 102(e) Date: Sep. 26, 1997

[87] PCT Pub. No.: WO97/17634

PCT Pub. Date: May 15, 1997

[30] Foreign Application Priority Data

Nov. 10, 1995 [JP] Japan .................................. 7-292841
Apr. 23, 1996 [JP] Japan .................................. 8-101261

[51] Int. Cl.$^6$ ........................................................ G03F 7/40
[52] U.S. Cl. ..................... 430/303; 430/331; 106/287.26
[58] Field of Search ....................... 430/303; 106/287.26; 130/331

[56] References Cited

U.S. PATENT DOCUMENTS

| | | | |
|---|---|---|---|
| 4,381,340 | 4/1983 | Walls | 430/302 |
| 4,496,647 | 1/1985 | Kawabe et al. | 430/303 |
| 4,617,251 | 10/1986 | Sizensky | 430/256 |
| 5,468,422 | 11/1995 | Khouzam et al. | 252/544 |
| 5,531,889 | 7/1996 | Baron et al. | 210/167 |
| 5,753,421 | 5/1998 | Sato et al. | 430/325 |

FOREIGN PATENT DOCUMENTS 0 336 400  10/1989  European Pat. Off.  ............... 430/303

*Primary Examiner*—Cynthia Hamilton
*Attorney, Agent, or Firm*—Morrison & Foerster LLP

[57] ABSTRACT

A treating liquid for making a waterless planographic printing plate with a photosensitive layer and a silicone rubber layer laminated in this order on a substrate, comprising at least one amine compound with two or more amino groups and one or more hydroxyl groups in one molecule.

A treating liquid for making a waterless planographic printing plate excellent in plate surface coatability and developability can be obtained.

9 Claims, No Drawings

TREATING LIQUID FOR MAKING A WATERLESS PLANOGRAPHIC PRINTING PLATE

TECHNICAL FIELD

The present invention relates to a treating liquid for making a waterless planographic printing plate, particularly relates to a treating liquid excellent in plate surface coatability and developability used for making a waterless planographic printing plate in an automatic developing machine, and also to a method for producing waterless planographic printing plates.

BACKGROUND ARTS

Conventionally, various printing plates for planographic printing without using dampening water utilizing a silicone rubber or fluorine resin as an ink repellent layer, particularly photosensitive waterless planographic printing plates prepared by selective exposure and development are proposed.

For example, there is a positive photosensitive waterless planographic printing plate with a photo-polymerizable adhesive layer and an ink repellent silicone rubber layer laminated on a substrate.

Furthermore, a waterless planographic printing plate with a photo merizable aphotosensitive layer and an ink repellent silicone rubber layer laminated on a substrate is also proposed. For developing them, JP-B-63-21890, etc. describe a development method using a propylene oxide derivative and a hydrocarbon, and JP-B63-33140, etc. describe a development method using water.

Moreover, JP-A-59-17552 discloses a method for obtaining a waterless planographic printing plate of either negative or positive type by treatment with a base of an image forming laminate in which a photosensitive layer composed of a material containing a quinonediazide structure and a silcone rubber layer are laminated in this order on a substrate. This patent specification also describes a method for obtaining negative and positive waterless planographic printing plates from one plate material wider in development latitude such as image reproducibility, solvent resistance and developability. The treatment method with a base described in it is to use an inorganic base and/or an organic base as a gas or liquid, and in the case of liquids it is described to use water or any publicly known organic solvent as a solvent.

JP-A-60-169852 discloses a method comprising the steps of exposing to an image, developing, fully exposing and treating by a base for fixing. Furthermore, JP-A-62-294246 describes the use of a polar solvent and an aminoalkanol as a treating liquid, and JP-A-63-201657, the use of a polar solvent, an alkoxyalkylamine, etc.

The treating liquids for making waterless planographic printing plates in these prior arts have such a problem that when a positive waterless planographic printing plate with a photo-polymerizable adhesive layer is used in an automatic developing machine, the developability fluctuates due to the evaporation of the hydrocarbon used or the absorption of water by the treating liquid. As a method for overcoming these disadvantages, JP-A-5-34931 proposes immersing in a treating liquid containing an alkylene carbonate before development by water.

In the case of a waterless planographic printing plate using a photosensitive layer composed of a material containing a quinonediazide structure, a base treating solution composed of an organic solvent and an organic base such as an amine is preferably used. However, if it is used in an automatic developing machine, its use for a long period of time is disadvantageous because the treating solution is poor in stability due to decline of amine concentration, etc.

As a method for overcoming these disadvantages, JP-A-63-179361 proposes a treating liquid containing a monoamine with ethylene oxide or propylene oxide added.

However, this method has a disadvantage in that when a waterless planographic printing plate with a silicone rubber layer as the uppermost layer is coated with a treating liquid by a spray, brush or pad, etc., a good image reproducibility cannot be obtained because the coatability on the plate surface is poor and uneven and because the treating liquid is poor in stability. So, a treating liquid for making a waterless planographic printing plate, which is good in stability, excellent in coatability and developability and large in the effect of treatment with a base, is demanded.

DISCLOSURE OF THE INVENTION

The object of the present invention is to provide a treating liquid for waterless planographic printing plates, which is good in stability, excellent in coatability and developability and large in the effect of treatment with a base.

The present invention provides a treating liquid for making a waterless planographic printing plate, in which a photosensitive layer and a silicone rubber layer are laminated in this order on a substrate, comprising at least one amine compound with two or more amino groups and one or more hydroxyl groups in one molecule. The present invention also provides a method for making a waterless planographic printing plate, comprising the step of exposing an original plate for waterless planographic printing to an image, and treating it.

BEST MODE FOR CARRYING OUT THE INVENTION

In the present invention, it is important that the treating liquid for making a waterless planographic printing plate contains at least one amine compound with two or more amino groups and one or more hydroxyl groups in one molecule. The amine compound is preferably represented by the following general formula (1):

$$H_2N-(C_2H_4NH)_n-L \qquad (1)$$

(where L stands for $-C_2H_4OH$ or $-CH_2CH(OH)CH_3$ or $-CH(CH_3)CH_2OH$. n stands for an integer of 1 to 10). The amine compound can be obtained, for example, by letting ethylene oxide or propylene oxide react with a compound represented by the following general formula (2):

$$R^1-NH-(C_2H_4NH)_n-R_2 \qquad (2)$$

(where $R^1$ and $R^2$ stand for a hydrogen atom or alkyl group with 1 to 15 carbon atoms, and n stands for an integer of 1 to 10).

The amine compound obtained by adding ethylene oxide or propylene oxide to the compound represented by the above formula (2) is good in compatibility with the solvent of the treating solution, excellent in stability and large in the effect of treatment with a base.

The reasons are that since the amine compound of the present invention is high in boiling point, the treating agent containing it is little changed in chemical composition by heat when the treating liquid is used in an automatic developing machine, and that since ethylene oxide and/or propylene oxide is added, its permeability into the photosensitive layer is good to enhance the effect of treatment with a base.

The amine compounds which can be used in the present invention include, though not limited to, the following:

(1) $H_2NC_2H_4NHC_2H_4OH$
(2) $CH_3NHC_2H_4NHC_2H_4OH$
(3) $C_4H_9NHC_2H_4NHC_2H_4OH$
(4) $C_{12}H_{25}NHC_2H_4NHC_2H_4OH$
(5) $HOC_2H_4NHC_2H_4NHC_2C_2H_4OH$
(6) $H_2N(C_2H_4NH)_2C_2H_4OH$
(7) $CH_3NH(C_2H_4NH)_2C_2H_4OH$
(8) $C_4H_9NH(C_2H_4NH)_2C_2H_4OH$
(9) $C_{12}H_{25}NH(C_2H_4NH)_2C_2H_4OH$
(10) $HOC_2H_4NH(C_2H_4NH)_2C_2H_4OH$
(11) $H_2N(C_2H_4NH)_3C_2H_4OH$
(12) $CH_3NH(C_2H_4NH)_3C_2H_4OH$
(13) $C_4H_9NH(C_2N_4NH)_3C_2H_4OH$
(14) $C_{12}H_{25}NH(C_2H_4NH)_3C_2H_4OH$
(15) $HOC_2H_4NH(C_2H_4NH)_3C_2H_4OH$
(16) $H_2N(C_{24}NH)_4C_2H_4OH$
(17) $CH_3NH(C_2H_4NH)_4C_2H_4OH$
(18) $C_4H_9NH(C_2H_4NH)_4C_2H_4OH$
(19) $C_{12}H_{25}NH(C_2H_4NH)_4C_2H_4OH$
(20) $HOC_2H_4NH(C_2H_4NH)_4C_2H_4OH$
(21) $H_2N(C_2H_4NH)_6C_2H_4OH$
(22) $CH_3NH(C_2H_4NH)_6C_2H_4OH$
(23) $CH_4H_9NH(C_2H_4NH)_6C_2H_4OH$
(24) $C_{12}H_{25}NH(C_2H_4NH)_6C_2H_4OH$
(25) $HOC_2H_4NH(C_2H_4NH)_6C_2H_4OH$
(26) $H_2N(C_2H_4NH)_8C_2H_4OH$
(27) $CH_3NH(C_2H_4NH)_8C_2H_4OH$
(28) $C_4H_9NH(C_2H_4NH)_8C_2H_4OH$
(29) $C_{12}H_{25}NH(C_2H_4NH)_8C_2H_4OH$
(30) $HOC_2H_4NH(C_2H_4NH)_8C_2H_4OH$
(31) $H_2NC_2H_4NHCH_2CH(CH_3)OH$
(32) $CH_3NHC_2H_4NHCH_2CH(CH_3)OH$
(33) $C_4H_9NHC_2H_4NHCH_2CH(CH_3)OH$
(34) $C_{12}H_{25}NHC_2H_4NHCH_2CH(CH_3)OH$
(35) $HOC_2H_4NHC_2H_4NHCH_2CH(CH_3)OH$
(36) $H_2N(C_2H_4NH)_2CH_2CH(CH_3)OH$
(37) $CH_3NH(C_2H_4NH)_2CH_2CH(CH_3OH$
(38) $C_4H_9NH(C_2H_4NH)_2CH_2CH(CH_3)OH$
(39) $C_{12}H_{25}NH(C_2H_4NH)_2CH_2CH(CH_3)OH$
(40) $HOC_2H_4NH(C_2H_4NH)_2CH_2CH(CH_3)OH$
(41) $H_2N(C_2H_4NH)_3CH_2CH(CH_3)OH$
(42) $CH_3NH(C_2H_4NH)_3CH_2CH(CH_3)OH$
(43) $C_4H_9NH(C_2H_4NH)_3CH_2CH(CH_3)OH$
(44) $C_{12}H_{25}NH(C_2H_4NH)_3CH_2CH(CH_3OH$
(45) $HOC_2H_4NH(C_{24}NH)_3CH_2CH(CH_3)OH$
(46) $H_2N(C_2H_4NH)_4CH_2CH(CH_3)OH$
(47) $CH_3N(C_2H_4NH)_4CH_2CH(CH_3)OH$
(48) $C_4H_9NH(C_2H_4NH)_4CH_2CH(CH_3)OH$
(49) $C_{12}H_{25}NH(C_2H_4NH)_4CH_2CH(CH_3)OH$
(50) $HOC_2H_4NH(C_2H_4NH)_4CH_2CH(CH_3)OH$
(51) $H_2N(C_2H_4NH)_6CH_2CH(CH_3)OH$
(52) $CH_3NH(C_2H_4NH)_6CH_2CH(CH_3)OH$
(53) $CH_4H_9NH(C_2H_4NH)_6CH_2CH(CH_3OH$
(54) $C_{12}H_{25}NH(C_2H_4NH)_6CH_2CH(CH_3)OH$
(55) $HOC_2H_4NH(C_2H_4NH)_6CH_2CH(CH_3)OH$
(56) $H_2N(C_2H_4NH)_8CH_2CH(CH_3)OH$
(57) $CH_3NH(C_2H_4NH)_8CH_2CH(CH_3)OH$
(58) $C_4H_9NH(C_2H_4NH)_8CH_2CH(CH_3)OH$
(59) $C_{12}H_{25}NH(C_2H_4NH)_8CH_2CH(CH_3)OH$
(60) $HOC_2H_4NH(C_2H_4NH)_8CH_2CH(CH_3)OH$

Among the above, preferable are (1), (2), (5), (6), (7), (10), (11), (12), (15), (16), (20), (21), (25), (26), (30), (31), (35), (36), (40), (41), (45), (46), (50), (51), (55), (56),(60), etc.

More preferable are (1), (2), (5), (6), (7), (31), (32), (35), (36), etc.

The amount of the amine compounded contained in the treating liquid is preferably 0.2 to 70 wt %, more preferably 0.5 to 50 wt % based on the weight of the treating liquid, in view of the effect of treatment with a base and image reproducibility.

In the present invention, it is preferable to let the treating liquid contain a nonionic surfactant.

The nonionic surfactant contained in the treating liquid is preferably 6 or higher in H.L.B. value.

H.L.B. expresses the balance between hydrophilicity and lipophilicity, and stands for Hydrophile-Lipophile Balance. The H.L.B. value is generally used as an indicator of hydrophilicity of a surfactant. The larger the value, the higher the hydrophilicity, and the smaller the value, the higher the lipophilicity.

In the case of an, ethylene oxide based nonionic surfactant, the H.L.B. value is obtained from the following formula:

E/S (E=Weight percent of polyoxyethylene portion), and in the case of a polyhydric alcohol based nonionic surfactant, it is obtained from the following formula:

20 (1 - S/A) (S=Saponification value of polyhydric alcohol ester, A=Neutralization value (oxidation) of fatty acid) (New Introduction published by (Sanyo Chemical Industries, Ltd.)

A nonionic surfactant allows the treating liquid to be applied uniformly on the plate surface, and good image reproducibility can be obtained.

The reason is that since the permeability into the photosensitive layer becomes good, the effect of treatment with a base and the effect of development processing become large. Furthermore, a nonionic surfactant has such advantages that it does not flaw the plate since it eases the stress of brushing, and that compared to other surfactants, it is less foamable and practical.

Above all as the nonionic surfactant in the treating liquid of the present invention, a polyethylene glycol derivative is preferable.

The nonionic surfactants of 6 or higher in H.L.B. preferably used in the present invention include, though not limited to, the following:

Polyoxyethylene alkyl ethers, polyoxyethylene phenyl ethers, polyoxyethylene polystyryl phenyl ethers, polyoxyethylene polyoxypropylene alkyl ethers, polyoxyethylene sorbitan fatty acid partial esters, polyoxyethylene sorbitol fatty acid partial esters, polyethylene glycol fatty acid esters, polyoxyethylenized castor oils, polyoxyethylene glycerol fatty acid partial esters, polyoxyethylene alkylamines, etc.

Among these nonionic surfactants, those of 10 or higher in H.L.B. are more preferable. One reason is that since a nonionic surfactant higher in H.L.B. value is better in affinity to water, the plate can be washed better when development is executed in the presence of water. Another reason is that since the permeability into the photosensitive layer becomes better, the action to assist the effect of treatment with a base by the amine is great.

A nonionic surfactant too low in H.L.B. value lowers developability and fixability unpreferably since it is lipophilic. The content of the nonionic surfactant is 0.1 to 30 wt %, preferably 0.5 to 20 wt %.

The solvent used in the treating liquid of the present invention is one or more as a mixture selected from water, alcohols (methanol, ethanol, 1-propanol, 2-propanol, 3-methoxybutyl alcohol, 2-methyl pentanol, ethylene glycol, diethylene glycol, triethylene glycol, polyethylene glycol, propylene glycol, dipropylene glycol, tripropylene glycol, polypropylene glycol, etc.), esters (butyl acetate, methyl cellosolve acetate, ethyl cellosolve acetate, carbitol acetate, ethyl carbitol acetate, etc.), diesters (dibutyl adipate, dibutyl sebacate, dibutyl phthalate, dioctyl adipate, dioctyl sebacate, dioctyl phthalate, etc.), ethers (ethylene glycol monomethyl ether, ethylene glycol dimethyl ether, diethylene glycol monomethyl ether, diethylene glycol dimethyl ether, diethylene glycol monobutyl ether, diethylene glycol monohexyl ether, diethylene glycol mono-2-ethylhexyl ether, diethylene glycol monolauryl ether, triethylene glycol monomethyl ether, triethylene glycol dimethyl ether, triethylene glycol monobutyl ether, tetraethylene glycol monomethyl ether, tetraethylene glycol dimethyl ether, polyethylene glycol monomethyl ether, propylene glycol monomethyl ether, propylene glycol monoethyl ether, dipropylene glycol monomethyl ether, dipropylene glycol monoethyl ether, tripropylene glycol monomethyl ether, polypropylene glycol monomethyl ether, etc.), ketones (cyclohexanone, acetylacetone, diacetone alcohol, etc.), etc.

Among the above, a polyethylene glycol derivative of 100 to 1000 in average molecular weight is preferable.

One reason is that since ethylene oxide is added, it is good in affinity to water, and as a result, the plate can be washed better when development is executed in the presence of water. Another reason is that since the permeability into the photosensitive layer becomes better, the action to assist the effect of treatment with a base by the amine is great. A treating liquid containing a polyethylene glycol derivative of less than 100 in average molecular weight is not preferable, since it is apt to change in chemical composition unpreferably and is likely to evaporate. Furthermore, a polyethylene glycol derivative of more than 1000 in average molecular weight is not preferable since it lowers developability and fixability unpreferably though it less changes the chemical composition.

The amount of the polyethylene glycol derivative used is 2 to 99.8 wt %, preferably 30 to 99.5 wt %, more preferably 40 to 99 wt % based on the weight of the treating liquid.

For use as a treating liquid for an automatic developing machine, it is preferable to select a solvent of 200° C. or higher in boiling point and 70° C. or higher in flash point from the above solvents.

When the original plate is developed with the pre-treating liquid, for example, a basic dye such as Aizen Victoria Blue BH or Aizen Marine RNX (produced by Hodogaya Chemical Co., Ltd.) can be added to the treating liquid so as to enable the plate to be inspected more easily.

Furthermore, the treating liquid can contain preferably 40 wt % or less of an aliphatic hydrocarbon (hexane, heptane, gasoline, kerosene, "Isopar" H, etc.) based on the weight of the polar solvent.

The original plate for waterless planographic printing to which the treating liquid of the present invention is applied is described below. The original plate for waterless planographic printing has a photosensitive layer and a silicone rubber layer laminated in this order on a substrate.

The substrate used in the present invention is not especially limited, and any of the substrates used in or proposed for ordinary waterless planographic printing plates can be used.

For example, a metallic sheet of aluminum, iron or zinc, a transparent or translucent plastic film of a polyester, polyolefin or polystyrene, or a composite sheet consisting of a metallic sheet and a plastic film can be used. Any of these sheets can also be coated with a resin layer, etc. for the purpose of antihalation, etc. for use as a substrate.

The photosensitive layer used in the present invention is preferably a photo-releasable photosensitive layer. A photo-releasable photosensitive layer in this case means a photosensitive layer, from which the silicone rubber layer is released by development in the exposed area only.

The photosensitive layer used in the present invention preferably contains a quinonediazide structure-containing material, as a component.

A photosensitive layer with a quinonediazide structure-containing material as a component used in the present invention refers to a photosensitive layer which is not substantially removed by development in the exposed area but has the silicone rubber layer removed in the corresponding area in the case of negative type, or has the silicone rubber layer removed in the non-exposed area in the case of positive type.

Such a photosensitive layer can be obtained by crosslinking a publicly known photo-solubilizable photosensitive compound by a polyfunctional compound or combining a monofunctional compound with the active groups in the photo-solubilizable photosensitive compound for modifying the photosensitive compound, to make it slightly soluble or insoluble in the developer.

A photo-solubilizable photosensitive compound can be an ester between a quinonediazide such as benzoquinone-1,2-diazidosulfonic acid and polyhydroxyphenyl, an ester between naphthoquinone-1,2-diazidosulfonic acid and pyrogallolacetone resin, or an ester between naphthoquinone-1,2-diazidosulfonic acid and phenol novolak resin, etc. respectively used in positive pre-sensitized plates, wipe-on plates, photoresists, etc. Furthermore, a photo-solubilizable photosensitive compound can also be obtained by simply mixing a low molecular quinonediazide compound (e.g., an ester compound between naphthoquinone-1,2-diazidosulfonic acid and phenol, cresol, xylenol, catechol, pyrogallol or bisphenol A, etc.) or a resin containing said quinonediazide groups, and a novolak resin not containing any photosensitive groups (e.g., a soluble fusible resin obtained by condensing naphthoquinone-1,2-diazidosulfonic acid, a phenol such as phenol, cresol, xylenol, catechol or pyrogallol, and a formaldehyde in the presence of an acidic catalyst).

The introduction of a crosslinked structure into such a photo-solubilizable photosensitive compound can be achieved by crosslinking the reactive groups such as hydroxyl groups of the photosensitive compound by a polyfunctional crosslinking agent.

The crosslinking agents which can be used include polyfunctional isocyanates such as paraphenylene diisocyanate, 2,4- or 2,6-tolylene diisocyanate, 4,4'-diphenylmethane diisocyanate, hexamethylene diisocyanate, isophorone diisocyanate and their adducts, and polyfunctional epoxy compounds such as polyethylene glycol diglycidyl ethers, polypropylene glycol diglycidyl ethers, bisphenol A diglycidyl ether, trimethylolpropane triglycidyl ether, etc. Their thermosetting is preferably executed in a temperature range not to lose the photosensitivity of the photosensitive material, usually lower than 130° C., and for this purpose, a catalyst, etc. is usually used together.

The reaction of a polyfunctional compound with a quinonediazide for modification to make it slightly soluble or insoluble in the developer can be achieved also, for example, by esterifying, amidating or urethanizing the active group of the quinonediazide. The compound used to react with the active group of the quinonediazide can be low or relatively high in molecular weight, or a monomer can also be graft-polymerized to the quinonediazide.

The photosensitive layer used in the present invention is especially preferably obtained by crosslinking or modifying the partial esterification product between naphthoquinone-1,2-diazido-5-sulfonic acid and phenol formaldehyde novolak resin by a polyfunctional or monofunctional isocyanate.

The proper thickness of the photosensitive layer is about 0.1 to 100 $\mu$, preferably about 0.5 to 10 $\mu$. If the thickness is too thin, defects such as pinholes are likely to occur at the time of coating, and if too thick on the other hand, an economical disadvantage is inevitable.

The photosensitive layer can contain other ingredients for the purposes of improving film formability, improving the adhesion to the substrate, etc. as far as the effect of the present invention is not impaired.

The silicone rubber layer preferably used in the present invention mainly contains a linear organic polysiloxane of thousands to hundreds of thousands in molecular weight, with a component as represented by the following formula:

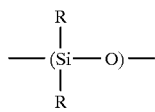

(where m stands for an integer of 2 or more; and R and R' stand for an alkyl group with 1 to 10 carbon atoms, alkenyl group or phenyl group; and it is preferable that 60% or more of the R and R' groups in one molecule are methyl groups).

To the linear organic polysiloxane, usually a crosslinking agent is added. The crosslinking agents which are used for room temperature (low temperature) setting-silicone rubbers include acetoxysilane, ketooximesilane, alkoxysilane, aminosilane, amidosilane, etc., and they are usually used in combination with a linear organic polysiloxane with hydroxyl groups at the ends, to form deacetylated, deoximized, dealcoholated, deaminated and deamidated silicone rubbers respectively. To these silicone rubbers, a small amount of an organic tin compound, etc. can also be added further as a catalyst.

Apart from the above, a crosslinked addition type silicone rubber layer obtained by addition reaction between SiH groups and —CH=CH— groups is also useful.

A general addition reaction crosslinkable silicone rubber composition preferably used in the present invention can be as follows:

| | | |
|---|---|---|
| (1) | A polyorganosiloxane with at least two or more alkenyl groups (preferably vinyl groups) directly connected with silicon atoms in one molecule | 100 parts by weight |
| (2) | A hydrogen polyorganosiloxane with at least two or more SiH groups in one molecule | 0.1~1000 parts by weight |
| (3) | Addition catalyst | 0.00001~20 parts by weight |

The alkenyl groups of the polyorganosiloxane shown as the ingredient (1) can be located at the ends or intermediate positions of the molecular chain, and the organic groups other than alkenyl groups can be selected from substituted or non-substituted alkyl groups and aryl groups. Furthermore, as required, it may have a small number of hydroxyl groups. The polyorganosiloxane shown as the ingredient (2) reacts with the ingredient (1), to form a silicone rubber layer, and also acts as a tackifier for the photosensitive layer The SiH groups of the ingredient (2) can be located at the ends or intermediate positions of the molecular chain, and the organic groups other than hydrogen can be —CH=CH— groups.

Of the organic groups of the ingredients (1) and (2), 60% or more of the total number of groups are preferably methyl groups in view of ink repellency. The molecular structures of the ingredients (1) and (2) can be of straight chain, cyclic or of branched chain. It is preferable in view of the physical properties of the rubber that at least either of them is more than 1000 in number average molecular weight, and it is more preferable that the polyorganosiloxane of the ingredient (1) is 1000 or more in number average molecular weight.

The polyorganosiloxane of the ingredient (1) can be, for example, α, ω-dimethylsiloxane or (methylvinylsiloxane) (dimethylsiloxane) copolymer with methyl groups at both the ends, etc.

The polyorganosiloxane of the ingredient (2) can be, for example, polydimethylsiloxane with hydroxyl groups at both the ends, α, ω-dimethylpolymethylhydrogensiloxane, (methylhydrogensiloxane) (dimethylsiloxane) copolymer with methyl groups at both the ends, polymethylhydrogencyclics, etc.

The addition catalyst of the ingredient (3) can be freely selected from publicly known catalysts, and especially a platinum compound such as platinum, platinum chloride or chloroplatinic acid can be preferably used. To moderately control the hardening rate of the addition reaction crosslinkable silicone rubber composition, a hardening retarder, etc.

is added. It can be, for example, an organopolysiloxane containing vinyl groups such as tetracyclo(methylvinyl) siloxane, an alcohol containing a carbon-carbon triple bond such as acetylacetone alcohol, acetone, methyl ethyl ketone, methanol, ethanol or propylene glycol monomethyl ether, etc.

Furthermore, any publicly known silane coupling agent, the polyorganosiloxane containing hydroxyl groups defined for the condensation reaction crosslinkable silicone rubber composition, or a condensation reaction crosslinking agent containing hydrolyzable functional groups can also be added to the addition reaction crosslinkable silicone rubber composition by a small amount.

The proper thickness of the silicone rubber layer is about 0.5 to 100 $\mu$, preferably about 0.5 to 10 $\mu$. If the thickness is too thin, a problem may occur in printing durability. If too thick on the other hand, an economical disadvantage is inevitable, and it becomes difficult to remove the silicone rubber layer during development, lowering image reproducibility.

In the printing plate used in the present invention, the adhesion between the substrate and the photosensitive layer and the adhesion between the photosensitive layer and the silicone rubber layer are very important for basic plate performance such as image reproducibility and printing durability. So, as required, an adhesive layer can be formed between the respective layers or an adhesion intensifying ingredient can be added to the respective layers. It is especially effective to form a layer of a publicly known silicone primer or silane coupling agent or to add a silicone primer or silane coupling agent to the silicone rubber layer or the photosensitive layer, for enhancing the adhesive strength between the photosensitive layer and the silicone rubber layer.

On the surface of the original waterless planographic printing plate composed as described above, a thin protective film can also be laminated.

The original waterless planographic printing plate used in the present invention can be produced, for example, as described below. At first, a substrate is coated with a composition solution destined to form a photosensitive layer using an ordinary coater such as a reverse roll coater, air knife coater, or Mayer bar coater, or a rotary coater like a whirler, dried, thermally cured as required, coated with an adhesive on the photosensitive layer as required, dried, and coated with a silicone gum solution on the photosensitive layer or the adhesive layer by a similar method, and heat-treated usually at a temperature of 50 to 130° C. for several minutes for sufficient hardening, to form a silicone rubber layer. As required, a protective film is laminated on said silicone rubber layer, to cover it, using a laminator, etc.

The original waterless planographic printing plate obtained as described above is exposed to an image using a positive film or positive original, or using a negative film or negative original, and developed to obtain a waterless planographic printing plate.

The production of a waterless planographic printing plate from an original waterless planographic printing plate can be executed, for example, as described below If an original positive waterless planographic printing plate is used, it is exposed to all image through a positive film or positive original kept in vacuum contact with it, to photodecompose 5 to 60 mol % of the quinonediazide component in the material containing a quinonediazide structure in the photosensitive layer by active rays, base-treated by the treating liquid of the present invention, and developed to obtain a positive waterless planographic printing plate.

On the other hand, if an original negative waterless planographic printing plate is used, it is exposed to an image as usual through a negative film or negative original kept in vacuum contact with it (an exposure to photodecompose more than 60 mol % of the quinoneadizide component in the material containing a quinonediazide structure in the photosensitive layer), base-treated by the treating liquid of the present invention, and developed after or during or before the treatment with a base, to obtain a waterless planographic printing plate More preferably, before or after the ordinary exposure to an image or after development, the original plate including the image area is fully exposed to photodecompose 5 to 60 mol % of the quinonediazide component in the material containing a quinonediazide structure in the non-image area of the photosensitive layer, and developed after base-treatment, or developed during base-treatment, or base-treated ater development.

In either case of positive or negative type, treatment with a base is considered to cause the amine compound in the treating liquid to act on the quinonediazide compound in the non-image area of the photosensitive layer and also on the indenecarboxylic acid produced by the decomposition of the quinonediazide compound, thereby enhancing the adhesive strength between the photosensitive layer and the silicone rubber layer.

The light source used in the step of exposure should be able to generate ultraviolet rays abundantly, and a mercury lamp, carbon arc lamp, xenone lamp, metal halide lamp or fluorescent lamp, etc. can be used. A laser beam, etc. can also be used instead of ultraviolet rays.

The treatment methods with a base by the treating liquid of the present invention include the following:

A. Negative type
(1) Full exposure→image exposure→base treatment→development
(2) Image exposure→full exposure→treatment with a base→development
(3) Full exposure→image exposure→simultaneous development and treatment with a base
(4) Image exposure→full exposure→simultaneous development and treatment with a base
(5) Full exposure→image exposure→development→treatment with a base
(6) Image exposure→full exposure→development→treatment with a base
(7) Image exposure→development→full exposure→treatment with a base
(8) Image exposure→development→treatment with a base
(9) Image exposure→treatment with a base→development
(10) Image exposure→simultaneous exposure and treatment with a base B. Positive type
(1) Image exposure→treatment with a base→development For treatment, the plate can be immersed in the treating liquid of the present invention, or in the case of an automatic developing machine, the plate surface can be wetted by a shower.

The treatment time is not especially limited, and can be properly selected, depending on the power and concentration of the amine compound, and temperature. Usually contact with the treating liquid gives an immediate effect, and long time contact does not change the effect at all. So, the treatment time can be usually about 10 seconds to 5 minutes.

As the developer, any of those usually proposed for waterless planographic printing plates can be used. For example, water or a mixture of water and any of the following polar solvents is suitable.

Alcohols (methanol, ethanol, etc.), ethers (ethyl cellosolve, ethyl carbitol, butyl carbitol, etc.), esters (cellosolve acetate, carbitol acetate, etc.), etc.

The treating liquid of the present invention can also be used for development.

If the base-treated plate is rubbed on the surface by a development pad or brush using the above developer, in case where the plate is used as a negative waterless printing plate, the silicone rubber layer is removed in the exposed area and the photosensitive layer acting as an ink receiving area is exposed.

On the other hand, for use as a positive waterless planographic printing plate, the silicone rubber layer is removed in the non-exposed area, to expose the photosensitive layer acting as an ink receiving area.

The present invention is described below in reference to examples, but is not limited thereby or thereto.

EXAMPLE 1

A 0.3 mm thick aluminum sheet (produced by Sumitomo Light Metal Industries, Ltd.) was coated with the following primer composition using a bar coater, and heat-treated at 200° C. for 2 minutes, to form a 5 μm primer layer.

| | | |
|---|---|---|
| (a) | Polyurethane resin (Sanprene LQ-T1331, produced by Sanyo Chemical Industries, Ltd.) | 100 parts by weight |
| (b) | Block isocyanate (Takenate B830, produced by Takeda Chemical Industries, Ltd.) | 20 parts by weight |
| (c) | Epoxy.phenol.urea resin (SJ9372, produced by Kansai Paint Co., Ltd.) | 8 parts by weight |
| (d) | Dimethylformamide | 725 parts by weight |

In succession, the above primer layer was further coated with the following photosensitive layer composition using a bar coater, and dried in 110° C. air for 1 minute, to form a 2 μm thick photosensitive layer.

| | | |
|---|---|---|
| (a) | Partial ester of naphthoquinone-1, 2-diazido-5-sulfonic acid and phenol formaldehyde novolak resin (25% in esterification degree by elementary analysis) (Sumilite Resin PR50622, produced by Sumitomo Durez) | 100 parts by weight |
| (b) | 4,4'-diphenylmethane diisocyanate | 40 parts by weight |
| (c) | Dibutyltin diacetate | 0.2 part by weight |
| (d) | 4,4'-diethylaminobenzophenone | 5 parts by weight |
| (e) | p-toluenesulfonic acid | 0.8 part by weight |
| (f) | Tetrahydrofuran | 800 parts by weight |

Then, the above photosensitive layer was further coated with the following silicone rubber composition by rotary coating, and wet-thermoset at 115° C. at a dew point of 30° C. for 3.5 minutes, to form a 2.3 μm thick silicone rubber layer.

| | | |
|---|---|---|
| (a) | Polydimethylsiloxane (about 25,000 in molecular weight, with OH groups at the ends) | 100 parts by weight |
| (b) | Vinyltri(methyl ethyl ketooxime)silane | 8 parts by weight |
| (c) | Dibutyltin diacetate | 0.1 part by weight |
| (d) | γ-aminopropyltrimethoxysilane | 0.5 part by weight |
| (e) | "Isopar" E (produced by Exxon Kagaku K.K.) | 1400 parts by weight |

On the laminate obtained as above, a 10 μ thick polypropylene film "Torayfan" (produced by Toray Industries, Ltd.) was laminated using a calender roller, to obtain an original waterless planographic printing plate.

The original plate was fully exposed at an illuminance of 11 mW/cm$^2$ measured by a UV meter (Light Measure Type UV-402A produced by Oak Seisakusho) for 6 seconds, using a metal halide lamp (Idol Fin 2000 produced by Iwasaki Electrc Co., Ltd.).

A negative film with a dot image of 150 lines/inch was kept in vacuum contact with the original plate obtained as above, and the plate was exposed to the image at a distance of 1 m for 60 seconds using said metal halide lamp.

A treating liquid with the following composition was poured into the pretreating tank of Toray Waterless planographic printing plate Automatic Developing Machine (TWL-1160D produced by Toray Industries, Ltd.), and water was poured into the developing tank.

| | | |
|---|---|---|
| (a) | Diethylene glycol mono-2-ethylhexyl ether | (100-x-1) wt % |
| (b) | 2-aminoethylethanolamine (Table 1) | x wt % |
| (c) | "Noigen" ET-109 | 1 wt % |

2-aminoethylethanolamine has a structure of $NH_2C_2H_4NHC_2H_4OH$, and corresponds to a compound obtained by letting ethylene oxide react with $R^1$—NH—$(C_2H_4NH)_n$—$R^2$.

"Noigen" ET-109 is a nonionic surfactant of 10 in H.L.B. value.

The automatic developing machine was set at a treatment temperature of 45° C., a developing water temperature of 25° C. and a carrying speed of 40 cm/min., and the above exposed plate remaining after removing "Torayfan" was fed through the automatic developing machine, to be developed. The printing plate was installed on an offset press, and printing was executed using "Toyo King Ultra TKU Aqualess G Blue PL" produced by Toyo Ink Mgf. Co., Ltd., to evaluate its dot reproducibility.

Table 1 shows the dot reproducibilities at respective amine concentrations of respective treating liquids.

EXAMPLE 2

A waterless planographic printing plate was obtained as described in Example 1, except that a treating liquid with the following composition was used.

| (a) | Tetraethylene glycol monomethyl ether | (100-x-1) wt % |
|---|---|---|
| (b) | N-hydroxyethyltriethylenetetramine (Table 1) | x wt % |
| (c) | "Noigen" ET-109 | 1 wt % |

N-hydroxyethyltriethylenetetramine has the structure $H_2N(C_2H_4NH)_3C_2H_4OH$, and corresponds to a compound with ethylene oxide added to an $R^1$—NH—$(C_2H_4NH)_n$—$R^2$.

The waterless planographic printing plate obtained in this manner was used for printing as described in Example 1, to examine its dot reproducibility. The result is shown in Table 1.

COMPARATIVE EXAMPLE 1

A waterless planographic printing plate was obtained as described in Example 1, except that a treating liquid with the following composition was used.

| (a) | Diethylene glycol | (100-x-1) wt % |
|---|---|---|
| (b) | Monoethanolamine (Table 1) | x wt % |
| (c) | "Noigen" ET-109 | 1 wt % |

Monoethanolamine has the structure $H_2NC_2H_4OH$, and does not correspond to a compound with ethylene oxide added to $R^1$—NH—$(C_2H_4NH)_n$—$R^2$.

The waterless planographic printing plate obtained like this was used for printing as described in Example 1, to examine its dot reproducibility. The result is shown in Table 1.

In Table 1, since the surfactant was added in an amount of 1 wt % when the amount of 2-aminoethylethanolamine concentration was 1 wt %, the amount of diethylene glycol mono-2-ethylhexyl ether was 98 wt %. That is, the treating liquid composition was 2-aminoethylethanolamine diethylene glycol mono-2ethylhexayl ether.: Noigen ET-109=1:98:1 (wt %). Since the surfactant was added in an amount of 1 wt % when the amount of 2-aminoethylethanolamine concentration was 10 wt %, the amount of diethylene glycol mono-2-ethylhexyl ether was 89 wt %. That is, the treating liquid composition was 2-aminoethylethanolamine: diethylene glycol mono-2-ethylhexyl ether: Noigen ET-109= 10:89:1 wt %.

As shown in Table 1, in the case of Examples 1 and 2 based on the present invention, the dot reproducibility was good irrespective of the amine concentration.

On the other hand, the treating liquid used in Comparative Example 1 did not show good dot reproducibility.

The reason is that the 2-aminoethylethanolamine with ethylene oxide added to $R^1$—NH—$(C_2H_4NH)_n$—$R^2$ was good in compatibility with the solvent, and large in the effect of treatment with a base.

EXAMPLE 3

Eighteen liters of a treating liquid with the following composition was poured into the pre-treatment tank of the same Toray Waterless planographic printing plate Automatic Processing Machine TWL1160D produced by Toray Industries, Ltd.) as used in Example 1, and 40 liters of water was poured into the developing tank.

| (a) | Diethylene glycol mono-2-ethylhexyl ether | 85 wt % |
|---|---|---|
| (b) | 2-aminoethylethanolamine | 10 wt % |
| (c) | "Noigen" ET-165 | 5 wt % |

2-aminoethylethanolamine has the structure $NH_2C_2H_4NHC_2H_4OH$, and corresponds to a compound with ethylene oxide added to $R^1$—NH—$(C_2H_4NH)_n$—$R^2$.

"Noigen" ET-165 is a nonionic surfactant of 16 in H.L.B. value.

The automatic developing machine was set at a treatment temperature of 45° C., a developing water temperature of 25° C. and a carrying speed of 40 cm/min. The waterless planographic printing plate obtained in Example 1 was exposed fully and subsequently to an image as described in Example 1, and the exposed plate remaining after removing "Torayfan" was fed through the automatic developing machine for development. Table 2 shows the result of dot reproducibility.

COMPARATIVE EXAMPLE 2

Eighteen liters of a treating liquid with the following composition was poured into the pretreating tank of the same Toray Waterless planographic printing plate Automatic Processing Machine (TWL-1160D produced by Toray Industries, Ltd.) as used in Example 1, and 40 liters of water was poured into the developing tank.

| (a) | Diethylene glycol mono-2-ethylhexyl ether | 85 wt % |
|---|---|---|
| (b) | Monoethanolamine | 10 wt % |
| (c) | "Noigen" EA-33 | 5 wt % |

Monoethanolamine has the structure $NH_2C_2H_4OH$, and does not correspond to a compound with ethylene oxide added to $R^1$—NH—$(C_2H_4NH)_n$—$R^2$.

"Noigen" EA-33 is a nonionic surfactant of 4 in H.L.B. value.

The waterless planographic printing plate obtained in this manner was used for printing as described in Example 3, to examine the dot reproducibility Table 2 shows the result of dot reproducibility.

As shown in Table 2, in the case of Example 3 based on the present invention, good image reproducibility was obtained.

The reason is that the addition of a surfactant large in H.L.B. value to the 2-aminoethanolamine with ethylene oxide added to $R^1$—NH—$(C_2H_4NH)_n$—$R^2$ improves the permeability into the photosensitive layer, to improve the effect of treatment with a base and the effect of development.

On the other hand, in Comparative Example 2, since the surfactant used was small in H.L.B. and was lipophilic, developability and fixability declined not allowing any good image reproducibility to be obtained.

EXAMPLE 4

Eighteen liters of a treating liquid with the following composition was poured into the pretreating tank of the same Toray Waterless planographic printing plate Automatic Processing Machine (TWL-1160D produced by Toray Industries, Ltd.) as used in Example 1, and 40 liters of water was poured into the developing tank.

| (a) | Diethylene glycol mono-2-ethylhexyl ether | 89 wt % |
|---|---|---|
| (b) | 2-aminoethylethanolamine | 10 wt % |
| (c) | "Noigen" ET-135 | 1 wt % |

2-aminoethylethanolamine has the structure $NH_2C_2H_4NHC_2H_4OH$, and corresponds to a compound with ethylene oxide added to $R^1$—NH—$(C_2H_4NH)_n$—$R^2$.

"Noigen" ET-135 is a nonionic surfactant of 13 in H.L.B value.

The automatic developing machine was set at a treatment temperature of 45° C., a developing water temperature of 25° C. and a carrying speed of 40 cm/min. The waterless planographic printing plate obtained in Example 1 was exposed fully and subsequently to an image as described in Example 1, and the exposed plate remaining after removing "Torayfan" was fed through the automatic developing machine for development. Plates of Kiku size (636×939 mm) were fed, and at the 500th plate and 1000th plate, the treating liquid was sampled to measure the amine concentration, and the dot reproducibility was also examined. The amine concentration was measured by potentiometric titration, and the dot reproducibility was examined as descried in Example 1. The results are shown in Table 3.

COMPARATIVE EXAMPLE 3

Eighteen liters of a treating liquid with the following composition was poured into the pretreating tank of the same Toray Waterless planographic printing plate Automatic Processing Machine (TWL-1160D produced by Toray Industries, Ltd.) as used in Example 1, and 40 liters of water was poured into the developing tank.

| (a) | Diethylene glycol | 90 wt % |
|---|---|---|
| (b) | Monoethanolamine | 10 wt % |

Monoethanolamine has the structure $H_2NC_2H_4OH$, and does not correspond to $R^1$—NH—$(C_2H_4NH)_n$—$R^2$. Furthermore, in Comparative Example 3, no surfactant was added.

As shown in Table 3, in the case of Example 4 based on the present invention, even if 1000 plates of Kiku size were fed, the dot reproducibility did not decline, and in addition, the concentration of 2-aminoethylethanolamine as the amine ingredient little declined, to allow long-time use of the treating liquid.

On the other hand, in the case of Comparative Example 3, after 500 plates were fed, the dot reproducibility declined from 2–98% to 5–90%. The reason is considered to be that the concentration of monoethanolamine as the amine ingredient declined from 15% to 2.5%, to remarkably lower the effect of treatment with a base, and the treating liquid was very short in life compared to the case of using a treating liquid of the present invention.

EXAMPLE 5

A positive film with a dot image of 150 lines/inch was brought into vacuum contact with a positive waterless planographic printing plate (TAPHG2) produced by Toray Industries, Ltd., and the plate was exposed to the image at a distance of 1 m for 60 seconds using a metal halide lamp ("Idol Fin" 2000 produced by Iwasaki Electric Co., Ltd.).

Then, a treating liquid with the following composition was poured into the pretreating tank of Toray Waterless planographic printing plate Automatic Processing Machine (TWL-1160D produced by Toray Industries, Ltd.), and water was poured into the developing tank.

| (a) | Diethylene glycol mono-2-ethylhexyl ether | 89 wt % |
|---|---|---|
| (b) | $NH_2C_2H_4NHCH_2CH(OH)CH_3$ | 10 wt % |
| (c) | "Noigen" ET-109 | 1 wt % |

$NH_2C_2H_4NHCH_2CH(OH)CH_3$ corresponds to a compound with propylene oxide added to $R^1$—NH—$(C_2H_4NH)_n$—$R^2$.

"Noigen" ET-109 is a nonionic surfactant of 10 in H.L.B. value.

The automatic developing machine was set at a treatment temperature of 45° C., a developing water temperature of 25° C. and a carrying speed of 40 cm/min. Then, a cover film was removed from the above exposed plate, and the plate was fed through the automatic developing machine for development. The printing plate was installed on an offset press, and printing was executed using "Toyo King Ultra TKU Aqualess G Blue PL" produced by Toyo Ink Mgf. Co., Ltd., to evaluate the dot reproducibility. As a result, a good dot reproducibility of 2% 98% was obtained.

INDUSTRIAL AVAILABILITY

A pretreating liquid can be obtained, which is highly stable, can be used for a long period of time, and is wide in the range to assure good image reproducibility.

TABLE 1

Dot reproducibilities obtained by using different amine compounds at different amine concentrations

| | | Dot reproducibilities at different amine concentrations (150 lines/inch, 1%~99%) | | | |
|---|---|---|---|---|---|
| | | 1 wt % | 5 wt % | 10 wt % | 20 wt % |
| Example 1 | 2-Aminoethylethanolamine | 2–95 | 2–98 | 2–98 | 2–98 |
| Example 2 | N-hydroxyethyltriethylenetetramine | 2–95 | 2–98 | 2–98 | 2–98 |
| Comparative example 1 | Monoethanolamine | 5–90 | 5–90 | 10–95 | 15–98 |

TABLE 2

Dot reproducibilities obtained by using different surfactants

| | Surfactant | H. L. B. value | Dot reproducibility (150 lines/inch, 1%~99%) |
|---|---|---|---|
| Example 3 | "Noigen" ET-165 | 16 | 2–98 |
| Comparative example 2 | "Noigen" EA-33 | 4 | 5–90 |

TABLE 3

Amine concentrations and dot reproducibilities obtained by using different treating liquids

| | Composition of treating liquid (ratio by weight) | | Number of plates of Kiku size fed | | | |
|---|---|---|---|---|---|---|
| | | | 500 plates | | 1000 plates | |
| | Amine compound | Surfactant | Amine concentration (wt %) | Dot reproducibility (150 lines/inch, 1~99%) | Amine concentration (wt %) | Dot reproducibility (150 lines/inch, 1~99%) |
| Example 4 | 2-Aminoethyl-ethanolmamine | "Noigen" ET-135 | 10 | 2–98 | 10 | 2–98 |
| Comparative Example 3 | Monoethanolamine | — | 2.5 | 5–90 | 1 | 5–80 |

We claim:

1. A treating liquid for making a waterless planographic printing plate with a photosensitive layer and a silicone rubber layer laminated in this order on a substrate, comprising a glycol and an amine compound comprising two or more amino groups and a hydroxyl group, wherein said glycol is selected from the group consisting of ethylene glycol, diethylene glycol, triethylene glycol, polyethylene glycol, propylene glycol, dipropylene glycol, tripropylene glycol and polypropylene glycol.

2. A treating liquid for making a waterless planographic printing plate according to claim 1, wherein the amine compound is represented by the following general formula (1):

$$H_2N-(C_2H_4NH)_n-L \qquad (1)$$

where L stands for —$C_2H_4OH$ or —$CH_2CH(OH)CH_3$ or —$CH(CH_3)CH_2OH$ n stands for an integer of 1 to 10.

3. A treating liquid for making a waterless planographic printing plate according to claim 1, wherein the amine compound is obtained by letting ethylene oxide or propylene oxide react with a compound represented by the following general formula (2):

$$R^1-NH-(C_2H_4NH)_n-R^2 \qquad (2)$$

where $R^1$ and $R^2$ stand for a hydrogen atom or allyl group with 1 to 15 carbon atoms, and n stands for an integer of 1 to 10.

4. A treating liquid for making a waterless planographic printing plate according to claim 1, wherein the amine compound content is 0.2 to 70 wt %.

5. A treating liquid for making a waterless planographic printing plate according to claim 1, wherein at least one nonionic surfactant of 6 or higher in H.L.B. value is additionally contained.

6. A treating liquid for making a waterless planographic printing plate according to claim 5, wherein the nonionic surfactant is a polyethylene glycol derivative.

7. A treating liquid for making a waterless planographic printing plate according to claim 1, wherein the photosensitive layer is a photo-releasable photosensitive layer.

8. A treating liquid for making a waterless planographic printing plate according to claim 1, wherein the photosensitive layer contains a quinonediazide structure-containing material as a component.

9. A method for producing a waterless planographic printing plate, comprising a step of treating a waterless planographic printing plate with a base after exposing to an image, by using any one of the treating liquids stated in any one of claims 1 through 8.

* * * * *